(12) United States Patent
Huot-Marchand et al.

(10) Patent No.: US 11,552,478 B2
(45) Date of Patent: Jan. 10, 2023

(54) MULTI-LEVEL ENCODING FOR BATTERY MANAGEMENT SYSTEM FIELD

(71) Applicant: NXP USA, Inc., Austin, TX (US)

(72) Inventors: Alexis Nathanael Huot-Marchand, Labastidette (FR); Laurent Bordes, Aucamville (FR); Simon Bertrand, Ramonville Saint Agne (FR)

(73) Assignee: NXP USA, Inc., Austin, TX (US)

( * ) Notice: Subject to any disclaimer, the term of this patent is extended or adjusted under 35 U.S.C. 154(b) by 357 days.

(21) Appl. No.: 16/934,403

(22) Filed: Jul. 21, 2020

(65) Prior Publication Data
US 2021/0050734 A1 Feb. 18, 2021

(30) Foreign Application Priority Data
Aug. 14, 2019 (EP) .................................. 19306015

(51) Int. Cl.
*H03M 5/02* (2006.01)
*H02J 7/00* (2006.01)
(Continued)

(52) U.S. Cl.
CPC ..... *H02J 7/00032* (2020.01); *H01M 10/4257* (2013.01); *H01M 10/441* (2013.01);
(Continued)

(58) Field of Classification Search
CPC .............. H04L 25/0272; H04L 25/0278; H04L 61/5038; H04L 7/02; H04L 25/0266;
(Continued)

(56) References Cited

U.S. PATENT DOCUMENTS 5,525,983 A 6/1996 Patel et al.
5,818,362 A 10/1998 Walker
(Continued)

FOREIGN PATENT DOCUMENTS

EP 2518957 A1 6/2012

OTHER PUBLICATIONS

Denso-Freescale-TRW, "DSI3 Bus Standard," Revision 1.00, Feb. 16, 2011, 45 pages.
(Continued)

*Primary Examiner* — Linh V Nguyen

(57) ABSTRACT

A battery management system comprises a first battery cell controller; a second battery cell controller, the first battery cell controller and the second battery cell controller each monitoring a plurality of battery cells; and a galvanically isolated transmission line providing a point-to-point signal transmission path between the first battery cell controller and the second battery cell controller. At least one of the first battery cell controller or the second battery cell controller includes at least one encoding/decoding circuit for encoding data for transmission as a serial data stream along the signal transmission path in compliance with a multi-level encoding technique, including modulating the serial data stream over at least three discrete signal levels at a predetermined and fixed data pulse frequency, encoding a plurality of data nibbles of the serial data stream into a data packet, the data packet including a plurality of symbols constructed and arranged with at least four consecutive chips per symbol, wherein the at least four consecutive chips per symbol of the data packet includes a DC balanced line code in each of the symbols.

20 Claims, 16 Drawing Sheets

(51) Int. Cl.
*H01M 10/42* (2006.01)
*H01M 10/44* (2006.01)
*H03M 5/18* (2006.01)
*H03M 5/20* (2006.01)
*H04L 25/49* (2006.01)
*H04L 67/12* (2022.01)

(52) U.S. Cl.
CPC .......... *H02J 7/0013* (2013.01); *H02J 7/0047* (2013.01); *H03M 5/18* (2013.01); *H03M 5/20* (2013.01); *H04L 25/4919* (2013.01); *H04L 25/4921* (2013.01); *H04L 25/4925* (2013.01); *H01M 2010/4271* (2013.01); *H04L 67/12* (2013.01)

(58) Field of Classification Search
CPC ............. H04L 25/0282; H04L 25/0294; H04L 25/4904; H04L 49/35; H04L 67/565; H04L 69/00; H04L 69/22; H04L 7/0008; H04L 7/033; H04L 7/046; H04L 9/40; H03M 5/18; H03M 5/20; H03M 7/6047; H03M 13/00; H03M 7/3059; H03M 3/356; H02J 7/0013; H02J 7/0048; H02J 2310/48; H02J 50/12; H02J 50/80; H02J 7/00; H02J 7/00032; H02J 7/0014; H02J 7/0047; H02J 7/005; H02J 7/007182; H02J 7/04
USPC ..................................................... 341/50, 51
See application file for complete search history.

(56) References Cited

U.S. PATENT DOCUMENTS

| | | | | |
|---|---|---|---|---|
| 7,093,145 | B2 | 8/2006 | Werner et al. | |
| 8,908,779 | B2* | 12/2014 | Douglass | H04L 25/0278 375/257 |
| 10,206,081 | B1* | 2/2019 | Hall | H04W 76/16 |
| 10,423,567 | B2* | 9/2019 | Khan | G06F 13/4291 |
| 10,785,065 | B2* | 9/2020 | Shuvalov | H04L 25/0272 |
| 11,105,860 | B2* | 8/2021 | Takeshita | H03K 21/40 |
| 2006/0075170 | A1* | 4/2006 | Behrendt | G06F 13/4291 710/110 |
| 2011/0280322 | A1* | 11/2011 | Suenaga | H04L 25/0278 375/257 |
| 2013/0019037 | A1* | 1/2013 | Flippin | H02J 7/0048 713/340 |
| 2013/0264881 | A1* | 10/2013 | Roeper | H02J 7/0014 307/77 |
| 2014/0129164 | A1* | 5/2014 | Gorbold | G01R 31/3835 702/63 |
| 2014/0306657 | A1* | 10/2014 | Lundgren | H02J 50/12 320/108 |
| 2015/0063494 | A1 | 3/2015 | Simpson et al. | |
| 2017/0010329 | A1* | 1/2017 | Tang | H04Q 9/00 |
| 2021/0109161 | A1* | 4/2021 | Huot-Marchand | G01R 31/3648 |

OTHER PUBLICATIONS

NXP Semiconductors, "PB_MC33771C, Battery cell controller IC, Product brief," Rev. 1.0, Jan. 20, 2020, Downloaded Jun. 1, 2020 from https://www.nxp.com/docs/en/product-brief/PB_MC33771C.pdf, 30 pages.

Botha, Louis, "Multilevel Sequences and Line Codes," Master of Engineering Thesis, University of Johannesburg, May 1, 1991, downloaded from https://core.ac.uk/download/pdf/54201146.pdf Jun. 1, 2020, 166 pages.

U.S. Appl. No. 16/934,458, filed Jul. 21, 2020, 30 pages.

Non-Final Office Action for U.S. Appl. No. 16/934,458, dated Aug. 3, 2022, 19 pages.

* cited by examiner

| Encoded Data (3-bits) | | Symbol Transmitted | | | |
|---|---|---|---|---|---|
| Binary | Hexadecimal | 1st Chip | 2nd Chip | 3rd Chip | 4th Chip |
| 001 | 0 | -1 | 1 | -1 | 1 |
| 001 | 1 | -1 | 1 | 0 | 0 |
| 010 | 2 | 0 | -1 | 1 | 0 |
| 011 | 3 | 0 | 0 | -1 | 1 |
| 100 | 4 | 0 | 0 | 1 | 0 |
| 101 | 5 | 1 | -1 | 0 | 0 |
| 110 | 6 | 1 | -1 | 1 | -1 |
| 111 | 7 | | | | |

| Encoded Data (8 bits) Hexadecimal | Symbol Transmitted | | | | | | | |
|---|---|---|---|---|---|---|---|---|
| | 1st Chip | 2nd Chip | 3rd Chip | 4th Chip | 5th Chip | 6th Chip | 7th Chip | 8th Chip |
| 00 | -1 | -1 | 1 | -1 | 1 | -1 | 1 | 1 |
| 01 | -1 | -1 | 1 | -1 | 1 | 1 | -1 | 1 |
| 02 | -1 | -1 | 1 | -1 | -1 | 1 | 0 | 0 |
| 03 | -1 | -1 | 1 | 1 | -1 | 1 | 1 | 1 |
| 04 | -1 | -1 | 1 | 1 | -1 | 1 | -1 | 1 |
| 05 | -1 | -1 | 1 | 1 | 1 | -1 | 0 | 0 |
| 06 | -1 | -1 | 1 | 1 | 0 | 0 | 1 | -1 |
| 07 | -1 | -1 | 1 | 1 | 0 | 0 | -1 | 0 |
| 08 | -1 | -1 | 1 | 1 | 0 | 0 | 0 | 1 |
| 09 | -1 | -1 | 1 | 1 | 0 | 1 | 1 | 0 |
| 0A | -1 | -1 | -1 | -1 | 1 | -1 | -1 | -1 |
| 0B | -1 | -1 | -1 | -1 | 1 | 1 | 0 | 0 |
| 0C | -1 | -1 | -1 | 1 | -1 | 1 | 1 | 1 |
| 0D | -1 | 1 | -1 | 1 | -1 | 1 | -1 | 0 |
| 0E | -1 | 1 | -1 | 1 | 0 | 1 | 1 | 1 |
| 0F | -1 | 1 | -1 | 1 | 0 | 1 | -1 | 0 |
| 10 | -1 | 1 | -1 | 1 | 0 | -1 | 1 | -1 |
| 11 | -1 | 1 | -1 | 1 | 0 | 0 | 0 | 0 |
| 12 | -1 | 1 | -1 | 1 | -1 | -1 | 1 | 1 |
| 13 | -1 | 1 | -1 | 1 | 0 | 1 | -1 | 0 |
| 14 | -1 | 1 | -1 | | -1 | 0 | -1 | -1 |
| 15 | . | . | . | . | . | . | . | . |
| . | . | . | . | . | . | . | . | . |
| 2F | -1 | 1 | 0 | 1 | -1 | -1 | 1 | 0 |
| . | . | . | . | . | . | . | . | . |

FIG. 12

| Encoded Data | | Symbol Transmitted | | | |
|---|---|---|---|---|---|
| Binary | Hexad. | 1st Chip | 2nd Chip | 3rd Chip | 4th Chip |
| 00000 | 00 | -2 | 2 | 0 | 0 |
| 00001 | 01 | -2 | 1 | 1 | 0 |
| 00010 | 02 | -1 | 1 | -1 | 1 |
| 00011 | 03 | -1 | 1 | 0 | 0 |
| 00100 | 04 | -1 | 1 | 1 | -1 |
| 00101 | 05 | -1 | 2 | -2 | 1 |
| 00110 | 06 | -1 | 2 | -1 | 0 |
| 00111 | 07 | -1 | -1 | 1 | 1 |
| 01000 | 08 | 0 | -2 | 1 | 0 |
| 01001 | 09 | 0 | -2 | 2 | 1 |
| 01010 | 0A | 0 | -1 | 1 | 0 |
| 01011 | 0B | 0 | -1 | 2 | 2 |
| 01100 | 0C | 0 | -1 | -1 | -1 |
| 01101 | 0D | 0 | 0 | 2 | -1 |
| 01110 | 0E | 0 | 0 | -1 | -1 |
| 01111 | 0F | 0 | 0 | 0 | 1 |
| 10000 | 10 | 0 | 0 | -2 | -2 |
| 00001 | 11 | 0 | 0 | 2 | -2 |
| 10010 | 12 | 1 | 1 | 1 | -2 |
| 10011 | 13 | 1 | 1 | -2 | -1 |
| 10100 | 14 | 1 | 2 | -2 | 0 |
| 10101 | 15 | 1 | 2 | 0 | 1 |
| 10110 | 16 | 1 | -2 | 1 | -1 |
| 10111 | 17 | 1 | -2 | 2 | 1 |
| 11000 | 18 | 1 | -1 | 1 | -1 |
| 11001 | 19 | 1 | -1 | 2 | 1 |
| 11010 | 1A | 1 | 3 | 0 | -1 |
| 11011 | 1B | 1 | 1 | -1 | -1 |
| 11100 | 1C | 2 | -2 | -2 | 1 |
| 11101 | 1D | 2 | -1 | -1 | -1 |
| 11110 | 1E | 2 | 0 | 0 | 0 |
| 11111 | 1F | 2 | -1 | -1 | 0 |

| RX1 | RX2 | RX3 | RX4 | Logic RX Value |
|---|---|---|---|---|
| 0 | 0 | 0 | 0 | 0 |
| 1 | 0 | 0 | 0 | 1 |
| 1 | 1 | 0 | 0 | 2 |
| 0 | 0 | 1 | 0 | -1 |
| 0 | 0 | 1 | 1 | -2 |

FIG. 16

MULTI-LEVEL ENCODING FOR BATTERY MANAGEMENT SYSTEM FIELD

The present disclosure relates generally to electric vehicle battery management systems, and more specifically, to encoding and decoding techniques for a physical layer of a data transmission of a battery management system to which a communication protocol can be applied.

BACKGROUND

In battery management system applications, electronic systems are developed to monitor an arrangement of lithium battery cells or the like, which store and output the energy required by various electronic devices of the vehicle, also referred to as automotive electronic control units, to operate an electric vehicle, for example, by controlling the charging and discharging functions of the battery cells. A battery management system typically includes one or more battery cell controllers mounted in series, each constructed and arranged for controlling several battery cells. The battery cell controllers communicate with a micro controller unit (MCU) that provides the intelligence of the system to control and monitors a state of the battery cells, for example, a battery health status, and can prevent the attempted operation of defective battery cells.

The growing volume of data required to be transferred between the different automotive electronic control units of a vehicle requires reliable and high speed data transmissions between the battery cell controllers managing the battery cells.

SUMMARY

Aspects of the disclosure are defined in the accompanying claims.

In a first aspect, there is provided a battery management system, comprising: a first battery cell controller; a second battery cell controller, the first battery cell controller and the second battery cell controller each monitoring a plurality of battery cells; and a galvanically isolated transmission line providing a point-to-point signal transmission path between the first battery cell controller and the second battery cell controller, wherein at least one of the first battery cell controller or the second battery cell controller includes: at least one encoding/decoding circuit for encoding data for transmission as a serial data stream along the signal transmission path in compliance with a multi-level encoding technique, including modulating the serial data stream over at least three discrete signal levels at a predetermined and fixed data pulse frequency, encoding a plurality of data nibbles of the serial data stream into a data packet, the data packet including a plurality of symbols constructed and arranged with at least four consecutive chips per symbol, wherein the at least four consecutive chips per symbol of the data packet includes a DC balanced line code in each of the symbols.

In one or more embodiments, the battery management system may further comprise: a microcontroller unit that outputs the data to the at least one of the first or second battery cell controller and manages the serial data stream including generating and outputting commands to the encoding/decoding circuit to control transitions between the at least three discrete signal levels.

In one or more embodiments, the battery management system may further comprise: a driver circuit between the micro controller unit and the transmission line that reads a plurality of sequential bits from the MCU and translates them to a multi-bit word for output as pulse bit data for output to the transmission line.

In one or more embodiments, the transmission line may include: a first transformer isolation circuit coupled to the first battery cell controller; a second transformer isolation circuit coupled to the second battery cell controller; and a twisted pair cable extending between the first and second transformer isolation circuits.

In one or more embodiments, the battery management system may further comprise a logic circuit that includes the at least one encoding/decoding circuit and a logic device which translates each symbol into a multi-bit word for output as the serial data stream to one of the first or second transformer isolation circuit.

In one or more embodiments, the at least four consecutive chips per symbol may include four consecutive transmissions per symbol.

In one or more embodiments, the first or second battery cell controller may include an adaptive multi-level transceiver including a transmit circuit, a receive circuit, and a logic circuit including a register that processes a configuration bit that controls at least one of the transmit circuit or the receive circuit to change from a first number of signal levels of the multi-level encoding technique to a second number of signal levels of the multi-level encoding technique to accommodate for a determined integrity of the transmission line.

In one or more embodiments, the first number of signal levels may be three signal levels and the second number of signal levels may be five signal levels.

In one or more embodiments, the at least one encoding/decoding circuit may transmit each of the symbols is transmitted via the four consecutive chips.

In one or more embodiments, the at least one encoding/decoding circuit may encode a three bit word of the data packet in two periods.

In one or more embodiments, the three-bit word may be encoded in four chips per symbol.

In one or more embodiments, the plurality of symbols may include eight symbols, and for each of the eight symbols, the at least one encoding/decoding circuit may encode a three-bit word in two periods.

In one or more embodiments, the data packet includes no reserve bits, and includes a same number of consecutive transmissions with a −1 level and a +1 level or a −2 level and a +2 level, and the addition of chips commensurate with the same number of consecutive transmissions is required to be null.

In one or more embodiments, the at least one encoding/decoding circuit may comprise: a first-in first-out (FIFO) memory that reads a predetermined number of sequential bits of the serial data stream and translates them to a multi-bit word; and an encoder/decoder that translates the multi-bit word into a pulse encoded symbol comprising the at least four consecutive chips per symbol.

In a second aspect, there is provided a semiconductor device, comprising: a bidirectional transceiver; and a logic circuit constructed and arranged to encode data for output from the bidirectional transceiver as a serial data stream along the signal transmission path that is modulated over at least three discrete signal levels at a predetermined and fixed data pulse frequency, the logic circuit encoding a plurality of data nibbles of the serial data stream into a data packet, the data packet including at least three symbols constructed and arranged with at least four consecutive chips per symbol, each chip assuming one of the three discrete signal levels;

wherein the at least three symbols are encoded into a subset of a maximum number of possible combinations of the at least three discrete signal levels, and wherein the circuit discards any combinations of the maximum number of possible combinations.

In one or more embodiments, the logic circuit may include the at least one encoding/decoding circuit and a logic device which translates each symbol into a multi-bit word for output as the serial data stream to a transformer isolation circuit.

In one or more embodiments, the at least one encoding/decoding circuit may comprise: a first-in first-out (FIFO) memory that reads a predetermined number of sequential bits of the serial data stream and translates them to a multi-bit word; and an encoder/decoder that translates the multi-bit word into a pulse encoded symbol comprising the at least four consecutive chips per symbol.

In one or more embodiments, the semiconductor device may further comprise an adaptive multi-level transceiver that includes a transmit circuit, a receive circuit, and a logic circuit including a register that processes a configuration bit that controls at least one of the transmit circuit or the receive circuit to change from a first number of signal levels of the multi-level encoding technique to a second number of signal levels of the multi-level encoding technique to accommodate for a determined integrity of the signal transmission path.

In a third aspect, there is provided a method for encoding data bits onto a transmission bus, comprising: configuring a battery cell controller for outputting a serial data stream to galvanically isolated transmission line; modulating the serial data stream over at least three discrete signal levels at a predetermined and fixed data pulse frequency; and encoding a plurality of data nibbles of the serial data stream into a data packet comprising at least three symbols constructed and arranged with at least four consecutive chips per symbol; and discarding combinations of the at least three discrete signal levels to provide DC balanced line code inside each of the symbols.

In one or more embodiments, the method may further comprise: reading a predetermined number of sequential bits of the serial data stream and translates them to a multi-bit word; and translating the multi-bit word into a pulse encoded symbol comprising the at least four consecutive chips per symbol.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 6 is a data encoding table for three-bit words, in accordance with an example embodiment of the present disclosure.

FIG. 9 is an illustrative example of codes of a data encoding table, in accordance with an example embodiment of the present disclosure.

FIG. 12 is a data encoding table, in accordance with an example embodiment of the present disclosure.

FIG. 16 is a receiver decoding data table, in accordance with an example embodiment of the present disclosure.

DETAILED DESCRIPTION

In brief overview, embodiments of the present inventive concepts include multi-level data encoding techniques for a communication protocol used in battery management system applications that exchanges data between a physical layer interface in electronic communication with the upstream battery cell controller and another physical layer interface with a downstream battery cell controller and/or between a battery cell controller and a microcontroller unit unit (MCU). Features of the inventive concepts provide for an increased data communication speed as compared to conventional battery management systems to accommodate for the growing demand of transferred data between electronic components of electric and hybrid vehicles. In some embodiments, the innovative multi-level data encoding techniques include an adaptive multi-level data encoding techniques and a corresponding physical layer to support the data encoding techniques. In addition, the data encoding technique when accommodating a point-to-point differential transmission line using a galvanically isolated bus including magnetically coupled and electrically coupled transformers. In some embodiments, the data encoding technique includes a three (3) signal level coding technique where data nibbles are encoded into a plurality of symbols, which in turn encodes information of a multi-bit word, in particular, a three-bit word or eight-bit-word. In other embodiments, the data encoding technique includes a five (5) signal level coding technique where data nibbles are encoded into a plurality of symbols, which in turn encodes information of a five-bit word. In some embodiments, a system is provided to improve the communication data speed in an electronic circuit by extending the number of chip into symbols from 4 to 8, or more. In some embodiments, a system is provided to improve a communication data speed by increasing the number of signal encoding levels from 3 to 5, or more.

Figure 1:
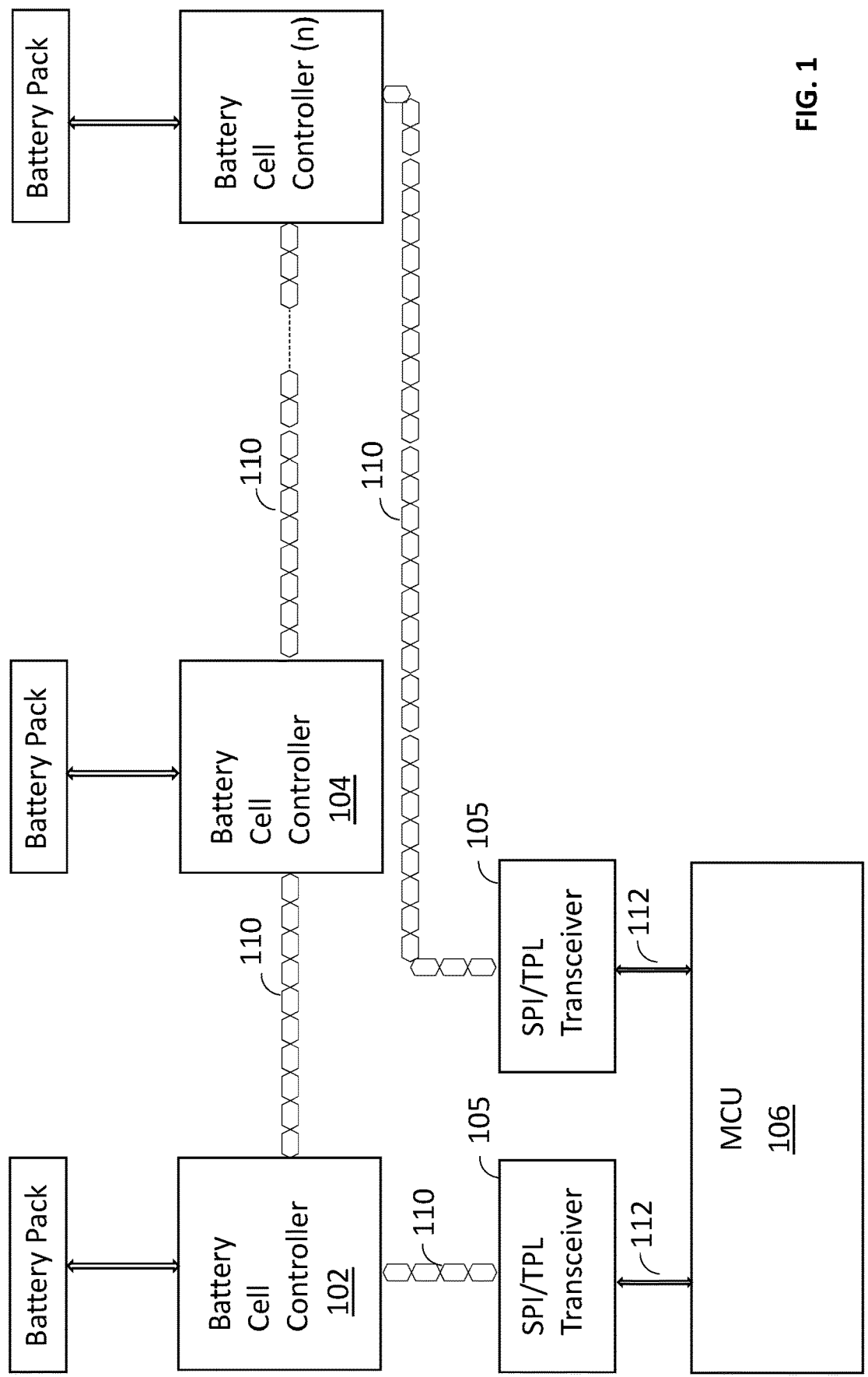
FIG. 1 is a block diagram of a battery management system, in accordance with an example embodiment of the present disclosure.

FIG. 1 is a schematic diagram illustrating in which embodiments of the present inventive concepts can be practiced.

As shown in FIG. 1, a battery management system includes a first battery cell controller 102, a second battery cell controller 104, and/or a special purpose hardware processor such as a microcontroller unit (MCU), which provides the intelligence of the system, for example, managing and controlling the plurality of battery cell controllers. Although two battery cell controllers are shown, a battery management system in accordance with some embodiments include more than two battery cell controllers configured to communicate with each other serially, i.e., also connected to one or more battery cell controllers (n) in a daisy chain configuration. The battery management system is not limited to those elements described in FIG. 1, and can include elements, features, and functions other than those illustrated in FIG. 1.

The battery management system is constructed and arranged to perform synchronous battery voltage/current measurement, coulomb counting, cell temperature measurement and integrated cell balancing, validation of the measurement integrity, and/or other functions related to automotive battery monitoring and maximizing the life of vehicle battery, for example, sensing the physical quantities of a lithium-ion battery, monitoring battery functions to validate the integrity of cell measurements, and so on. Each of the first battery cell controller 102 and a second battery cell controller 104 can monitor a battery pack comprising a plurality of battery cells, for example, ranging from 6-18 cells but not limited thereto. In doing so, data communications are established between the first battery cell controller 102, second battery cell controller 104, and microcontroller unit (MCU) 106. A galvanically isolated transmission line, or bus 110, may extend between the first battery cell controller 102 and the second battery cell controller 104, and/or between at least one of the battery cell controllers 102, 104 and the MCU 106 to provide a point-to-point differential communication between these various circuits. In some embodiments, the battery cell controllers 102, 104 are co-located in a same module, circuit board, housing, and so on. In some embodiments, at least one of the battery cell controllers 102, 104 and the MCU 106 are co-located in a same module, circuit board, housing, and so on.

In some embodiments, the battery management system includes a driver circuit having a serial peripheral interface (SPI)/transformer isolation (TPL) transceiver 105 between the MCU 106 and a battery cell controller 102 of a daisy-chain configuration of two more battery cell controllers. The SPI/TPL transceiver 105 is constructed and arranged to receive data from the MCU 106 via a serial peripheral interface 112 and connect the MCU 106 to a high speed isolated communication network that includes a galvanically isolated transmission line 110 and convert the data to be output to the battery cell controller 102 via the transmission line 110. The SPI/TPL transceiver 105, also referred to as a driver circuit, includes a physical layer transceiver that is constructed and arranged to interface a microcontroller such the MCU 106 to a high speed isolated communication network that includes the transmission line 110

Figure 2:
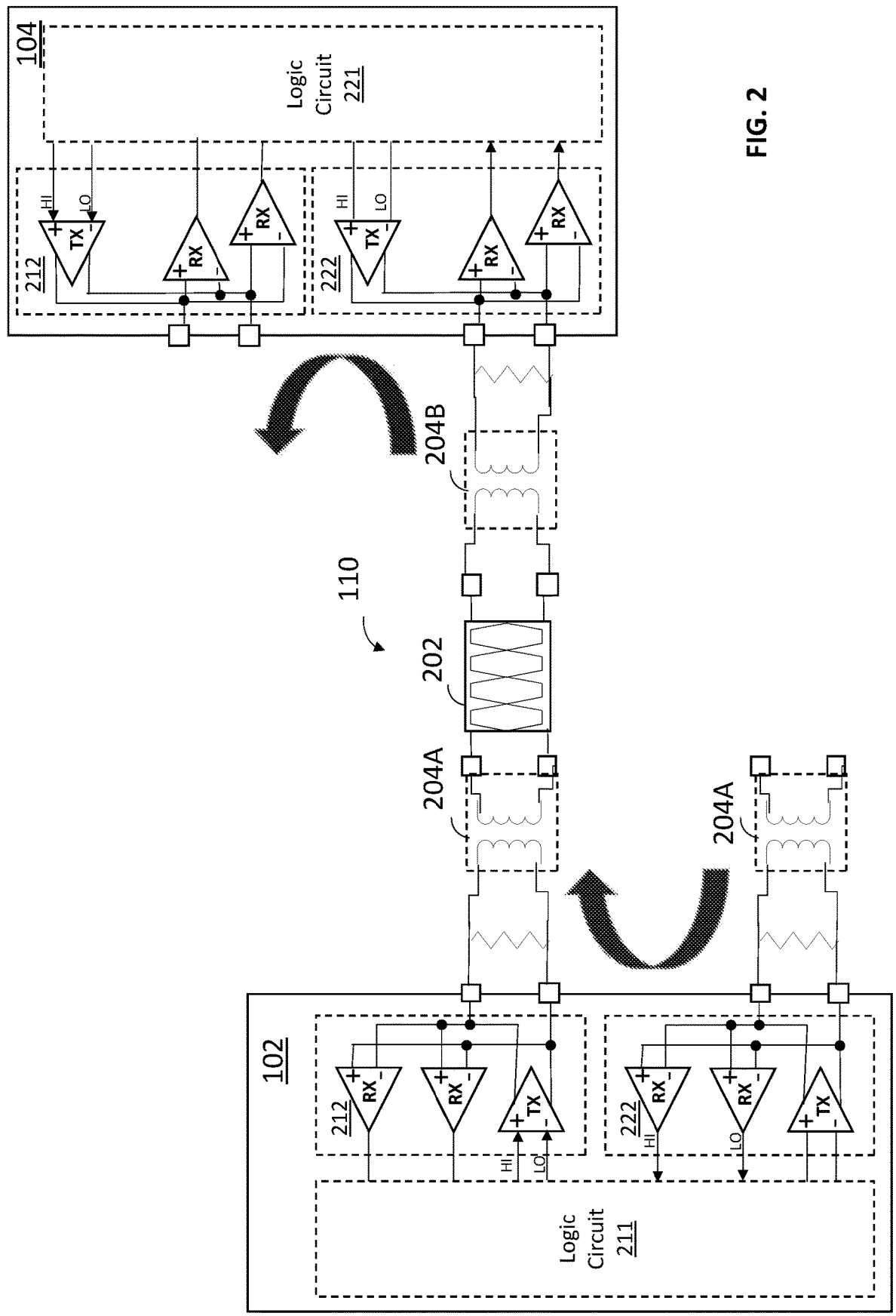
FIG. 2 is a schematic diagram of a physical layer interface of two battery cell controllers including galvanically isolated bus communication for the battery management system of FIG. 1.

As shown in FIG. 2, the transmission line 110 provides high speed point-to-point differential isolated communications using transformer isolation circuits 204 between the upstream bidirectional transceiver 212 of the battery cell controller 102 in a transmitter mode, and the downstream bidirectional transceiver 222 of the battery cell controller 104 in a receiver mode. The data communication is exchanged between the battery cell controller 102 and the battery cell controller 104 as indicated by the arrows. Since the communication is bidirectional, the upstream transceiver 212 of the battery cell controller 104 can operate in the receiver mode and transfer the data to the downstream transceiver 222, working in the transmitter mode, of the battery cell controller 104 via the logic circuit 221. The data is output from the battery cell controller 104 to the battery cell controller 102 in the opposite direction of the arrows via the transmission line 110 and the transceiver 212 of the battery cell controller 102 is switched to its receiver mode. As the data propagates through the daisy chain from one battery cell controller to another one via the downstream and upstream transceivers of each battery cell controller, there is no loss on the integrity of the data signals and the transmission is ensured with an unattenuated message. A twisted pair cable 202 of the transmission line ensures the connection between two battery cell controllers, which are located on different boards in the vehicle. The transformer circuit 204A allows the DC isolation between the twisted pair cable 202 and the battery cell controller 102 whereas the transformer circuit 204B allows the DC isolation between the twisted pair cable 202 and the battery cell controller 104. This electrically protects the battery cell controllers 102, 104 of any transient voltage or undesired electrical connection present on the twisted pair cable 202.

Figure 3:
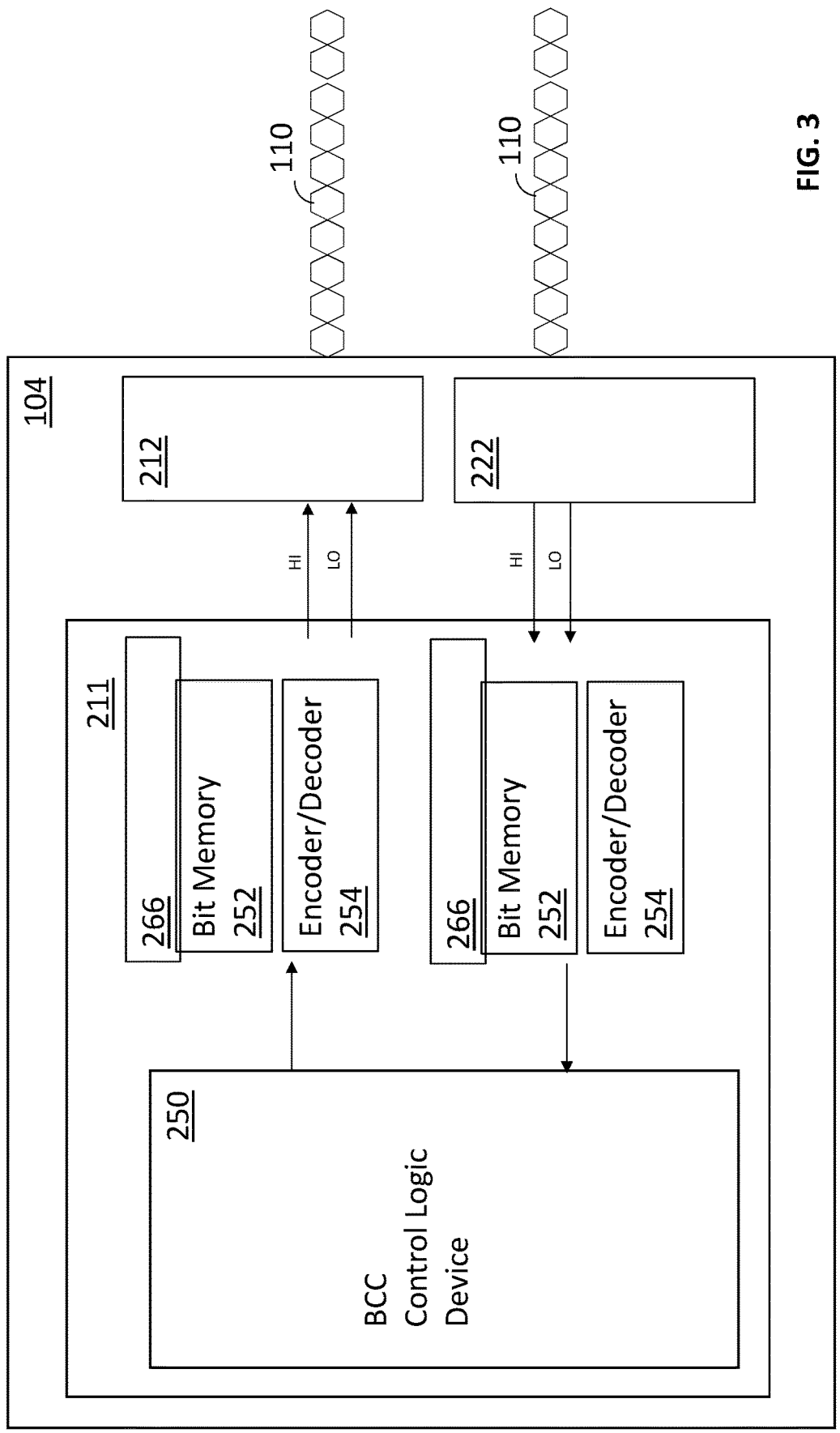
FIG. 3 is a block diagram of a detailed physical layer interface of a battery cell controller, in accordance with an example embodiment of the present disclosure.

The communications illustrated in FIGS. 1-3 comply with a communication protocol having a physical layer formed between physical interfaces of the battery cell controllers 102, 104 and the MCU 106, respectively. The physical layer of the communication protocol stack may include a physical signaling sublayer where encoding, transmission, decoding, and galvanic isolation functions are performed between the battery cell controllers 102, 104 and/or between a battery cell controller 102 and/or 104 and MCU 106 so as to break up ground loops and prevent the undesirable flow of direct current (DC) in the daisy chain, and to ensure a correct discharge of the transformers of the bus 110 without a DC offset.

FIG. 3 is a block diagram of a logic circuit of a battery cell controller, for example, logic circuit 211 and transceivers 212 and 222 of a battery cell controller 102 shown in FIG. 2. Although reference to battery cell controller 102 as a data transmitting device is shown and described, a comparable logic circuit 221 and transceivers 212 and 222 of a battery cell controller 104 operating as a receiving device can equally apply.

The bus driver transceiver 212, 222 and encoding/decoding circuit 266 can include components similar to the SPI/TPL transceiver 105 between the MCU 106 and battery cell controller 102.

As shown in FIG. 3, in some embodiments, the logic circuit 211, 221 can each include but not be limited to a battery cell controller (BCC) logic device 250 and at least one encoding/decoding circuit 266. As shown, one encoding/decoding circuit 266 can communicate with a transmit driver 212 of a transceiver and another encoding/decoding circuit 266 can communicate with a receive driver 222 of a transceiver. The BCC logic device 250 provides global control logic functions for the battery cell controller, such as battery cell balancing, current chain measurement, voltage cell measurement, and so on.

Each encoding/decoding circuit 266 can include but not limited to a first-in first-out (FIFO) memory 252 and an encoder/decoder 254. A SPI/TPL transceiver 105 shown in FIG. 1 and/or bidirectional transceivers 212, 222 of the battery cell controllers 102, 104 can include the encoding/decoding circuit 266 and therefore can include a bit memory 152 and encoder/decoder circuit 154. The bit memory device 252, for example, a first-in/first-out (FIFO) memory, can reads a number of sequential bits received from the MCU 106 and translates them to a multi-bit word. The encoder/decoder 254 translates the word into a multi-level pulse encoded symbol comprising four or more consecutive transmissions, or chips. In some embodiments, the encoder/decoder 254 stores and/or otherwise processes data of the encoder/decoder table, for example, in FIG. 9 or 12. The encoder/decoder 254 in response outputs a binary level corresponding to the symbol transmissions on the high and low inputs of the analog interface of the transceiver 212.

One example of operation of the battery management system is provided as follows, which includes a data exchange between the MCU 106 and a battery cell controller 102 and/or 104. The SPI/TPL transceiver 105 receives a plurality of bits 1, 0, 0, 1, which are sequentially output from the MCU 106 to the SPI/TPL transceiver 105 via the serial peripheral interface 112. The SPI/TPL transceiver 105 includes a transceiver physical layer transformer driver that is constructed and arranged to interface a microcontroller such the MCU 106 to a high speed isolated communication network that includes the transmission line 110. In doing so, the data bits are directly converted by the SPI/TPL transceiver 105 to pulse bit information and transferred to the transmission line 110. In this example, the SPI/TPL transceiver 105 reads the 5 sequential bits received from the MCU 106 and translates them to a 5 bit word (10011). The SPI/TPL transceiver 105 then translates the five-bit word (10011) into a multi-level pulse encoded symbol comprising four consecutive transmissions, or chips configured to process five different levels (e.g., 0, 1, 2, −1, −2) (see table 500 of FIG. 6). In response, a binary level is generated corresponding to the symbol transmissions (e.g., high, low) to an analog interface of the SPI TPL transceiver 105. The analog interface in turn outputs analog signals by activating or deactivating pull-up and/or pull-down circuits at each analog output. The resulting pull-up and pull-down paths permit a generated current to flow through the transmission line 110 into a bus termination resistance.

Another example of operation of the battery management system is provided as follows, which includes a data exchange between the BCC 102 and BCC 104 via transmission line 110: The BCC 102 (or 104) receives analog signals via the transmission line 110. An analog interface of the receiving transceiver 222 converts the signals (e.g., High: 0, 1, 0, 1; Low: 0, 0, 2, 0), using pull-up/pull-down voltage circuits or the like, so that the decoding circuit 266 can translates the output of the analog interface of the transceiver 222 to a multi-level pulse encoded symbol comprising four consecutive transmissions, or chips (e.g., 0, 1, −2, −1), which in turn is output to the battery cell controller (BCC) logic device 250, which translates the symbol into the five-bit word (10011).

Figure 4:
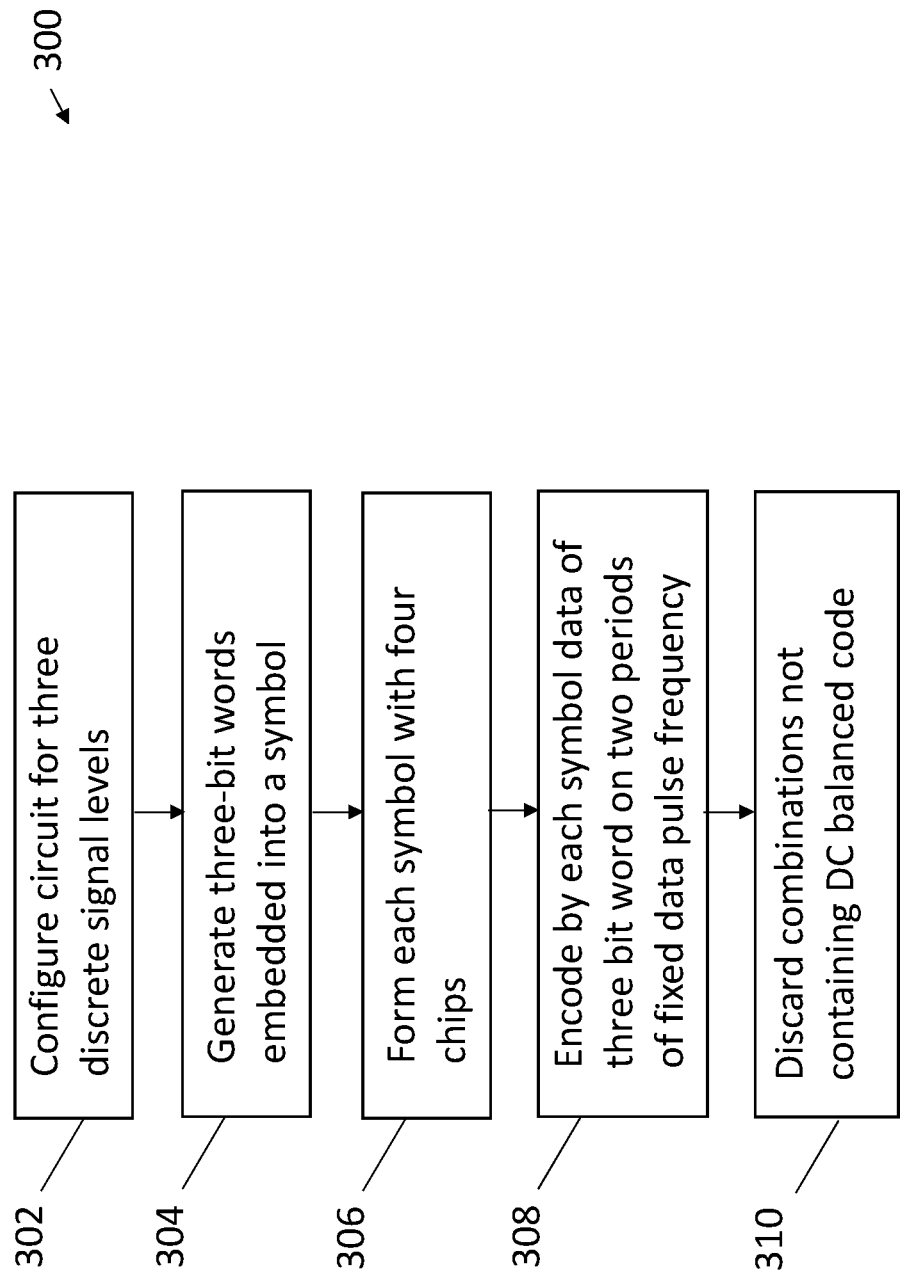
FIG. 4 is a flowchart illustrating a method for three-level encoding performed by a battery management system, in accordance with an example embodiment of the present disclosure.

As described herein, embodiments are not limited to the processing of five signal levels. For example, FIG. 4 is a flowchart illustrating a method 300 for three-level encoding performed by the battery management system of FIGS. 1-3.

In operation, at block 302, the battery management system shown in FIGS. 1-3 is constructed and arranged for three-level encoding, for example, using three different signal levels (e.g., −1, 0, +1), e.g., voltage, current, or amplitude levels, to transmit and receive binary digits, e.g., 1 or 0 bit corresponding to data packets or other units of data, depending on the transitions between the levels. For example, an encoding circuit of the battery management system encodes logic (1) or (0) bits corresponding to transitions between voltage levels of the different signal levels. In other embodiments, an encoding/decoding circuit 266 of the battery management system performs related encoding functions when exchanging signal information with the bus 110.

In some embodiments, the battery management system includes a three-level encoding circuit of the SPI TPL transceiver 105 between the MCU 106 and a battery cell controller 102 to generate signal levels corresponding to consecutive chips providing the symbols used for arranging data for output to the isolated transmission line 110. In some embodiments, the three-level encoding circuit is part of the battery cell controller 102, 104, and/or other battery cell.

At block 304, a plurality of data units such as nibbles are generated. In some embodiment, a data nibble of a data unit is a three-bit word embedded into a symbol. The data nibbles are generated from the five signal levels (−1, 0, 1) for encoding into the three symbols, e.g., a three symbol data packet including 9 bits of data. The pulse-encoded symbols are then encoded into signal levels to form a set of three bit words, e.g., each symbol corresponding to a three bit word.

Figure 5:
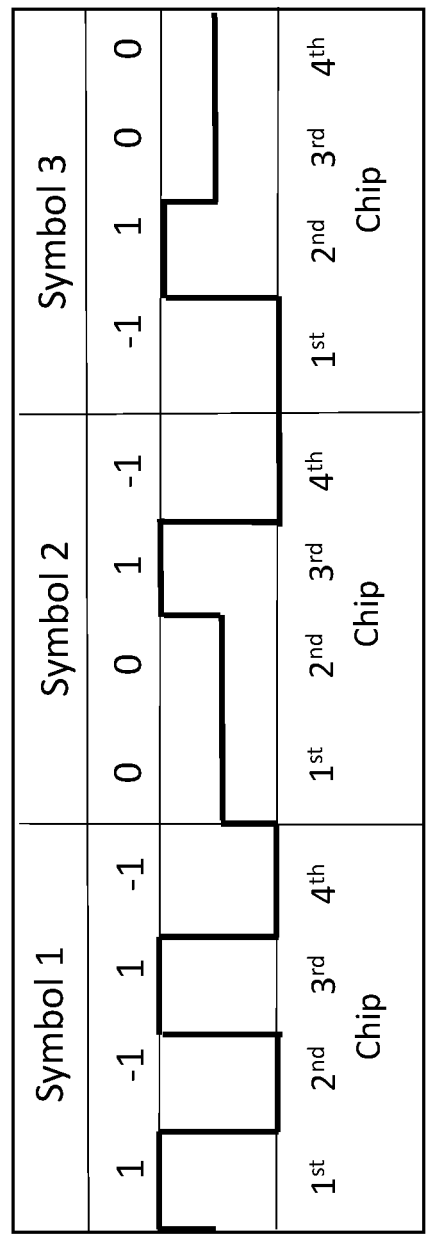
FIG. 5 is an illustrative example of a three-symbol data packet encoded at three signal levels, in accordance with an example embodiment of the present disclosure.

At block 306, each symbol is produced with four consecutive transmissions, referred to as $1^{st}$ through 4th "chips" that each assumes one of the three discrete levels for signal pulses used for encoding positive, negative, and zero, respectively, as shown in FIG. 5. In some embodiments, the data pulses are single period pulse waves that indicate a logic 1 or 0 value based on the phase.

In some embodiments, as shown in block 308, each symbol encodes the information of a 3-bit word. A data encoding table can include combinations of signal levels or values that are recognized, translated, or otherwise established according to a predetermined computer standard, protocol, criteria, or the like. In block 310, the data encoding table is constructed and arranged so that undesirable combinations that do not contain a DC balanced code are discarded, for example, described by way of example herein.

Figure 10:
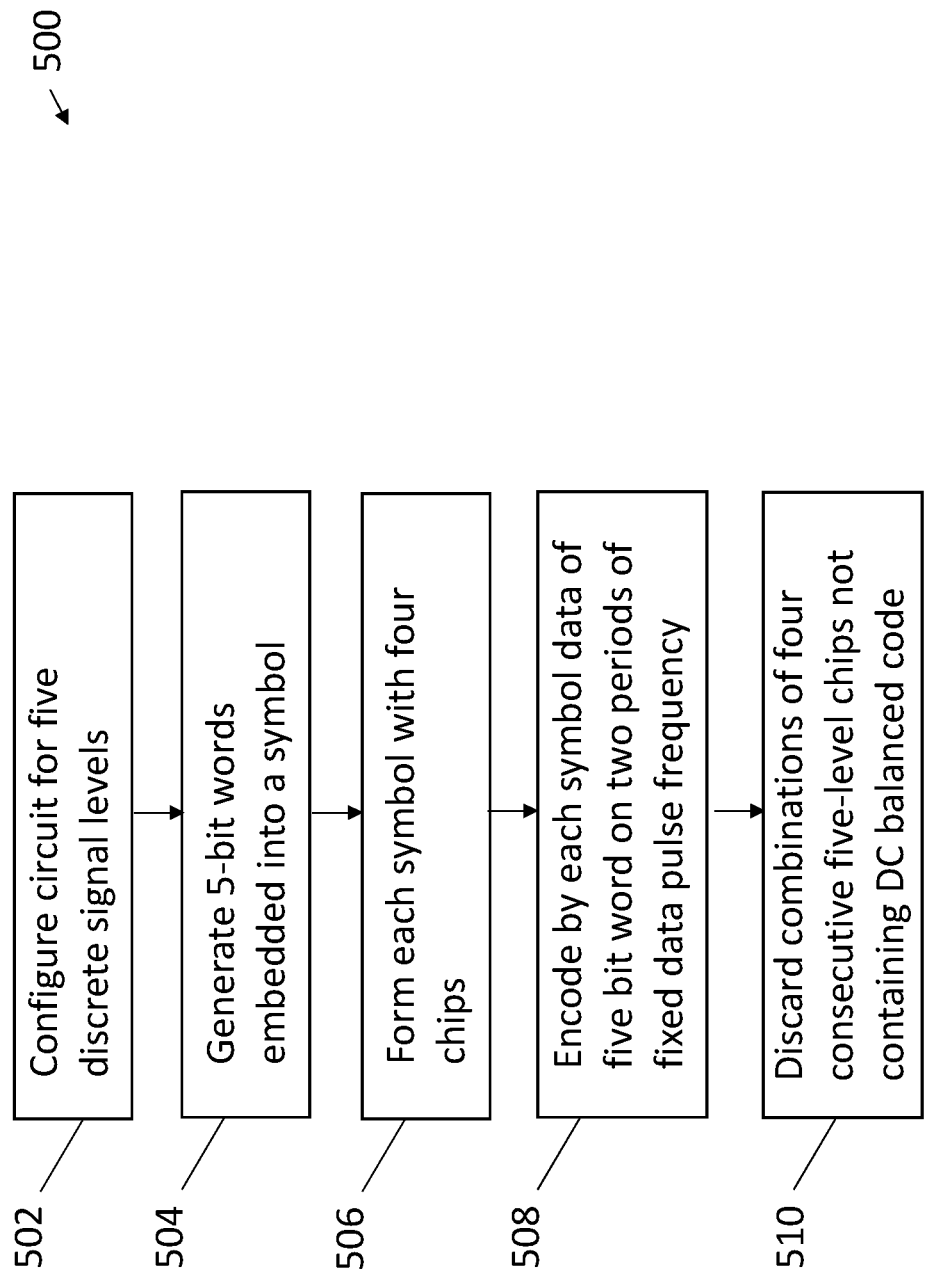
FIG. 10 is a flowchart illustrating a method for multi-level encoding for a battery management system, in accordance with an example embodiment of the present disclosure.

As previous described, the system illustrated in FIGS. 1-3 may be constructed and arranged for other coding techniques. One such technique is described in the method 300 of FIG. 4, but is not limited thereto. As shown in the illustration 350 in FIG. 5, other embodiments may include a three level coding technique applied to a three symbol data packet that includes nine (9) data bits, where each symbol encodes the information of a three (3) bit word. The communication protocol defines the number of data bits in each message that is related to the number of symbols per message. As shown in FIG. 5, each symbol transmitted via four (4) chips encodes the information of a three (3) bit word in two (2) periods of a fixed data pulse frequency, for a total of 12 chips or 9 data bits. By comparison, conventional encoding techniques transmit one (1) bit in two (2) periods. Therefore, the embodiment described with reference to FIG. 10 provides a speed ×3 ratio improvement of at least 3× over such conventional encoding techniques. For example, a 4.0 MHz frequency used by a physical layer of a communication protocol may result in a 6.0 Mbps data communication speed. Accordingly, an electrical circuit does not require hardware modifications if it is configured for a particular fixed frequency such as 4.0 MHz and requires no modification to the design circuitry producing the fixed frequency. Other configurations may equally apply, for example, a three-level coded approach where data nibbles are encoded into symbols formed of three consecutive transmissions, where each symbol encodes the information, or content, of a four-bit word in 1.5 periods. Regardless of configuration, the embodiments permit no criteria in this data encoding technique to perform a DC balanced code operation, which provides a relevant parameter for physical layers of a data protocol using a transformer and/or capacitive isolation bus 110.

In some embodiments, eighty one (81) combinations of four consecutive three-level chips (i.e., $3^4$) are possible. As previously described, information regarding these combinations may be stored in a register of the control logic of the battery cell controller can discard various combinations of four consecutive multi-level chips to avoid isolation transformer saturation and performing a DC balanced line code inside each of the three symbols. In doing so, the system complies with a set of predetermined criteria for discarding undesirable combinations, for example, a criteria that establishes that all combination containing the same value (1, 0, −1) are to be discarded, which assures that any response packet having at least one transition in every symbol. Another criteria may establish that all combinations that contain a chip at value (−1) without a neighboring chip at a value (−1) are to be discarded. The last two characteristics allow the system to prevent the saturation of the isolation transformers 204 and to perform a DC balanced line code operation inside each symbol.

After the undesirable combinations are discarded, the eight remaining possible combinations can be executed to allow for the encoding of information in a multi-bit word, shown in data decoding table 360 of FIG. 6.

Figure 7:
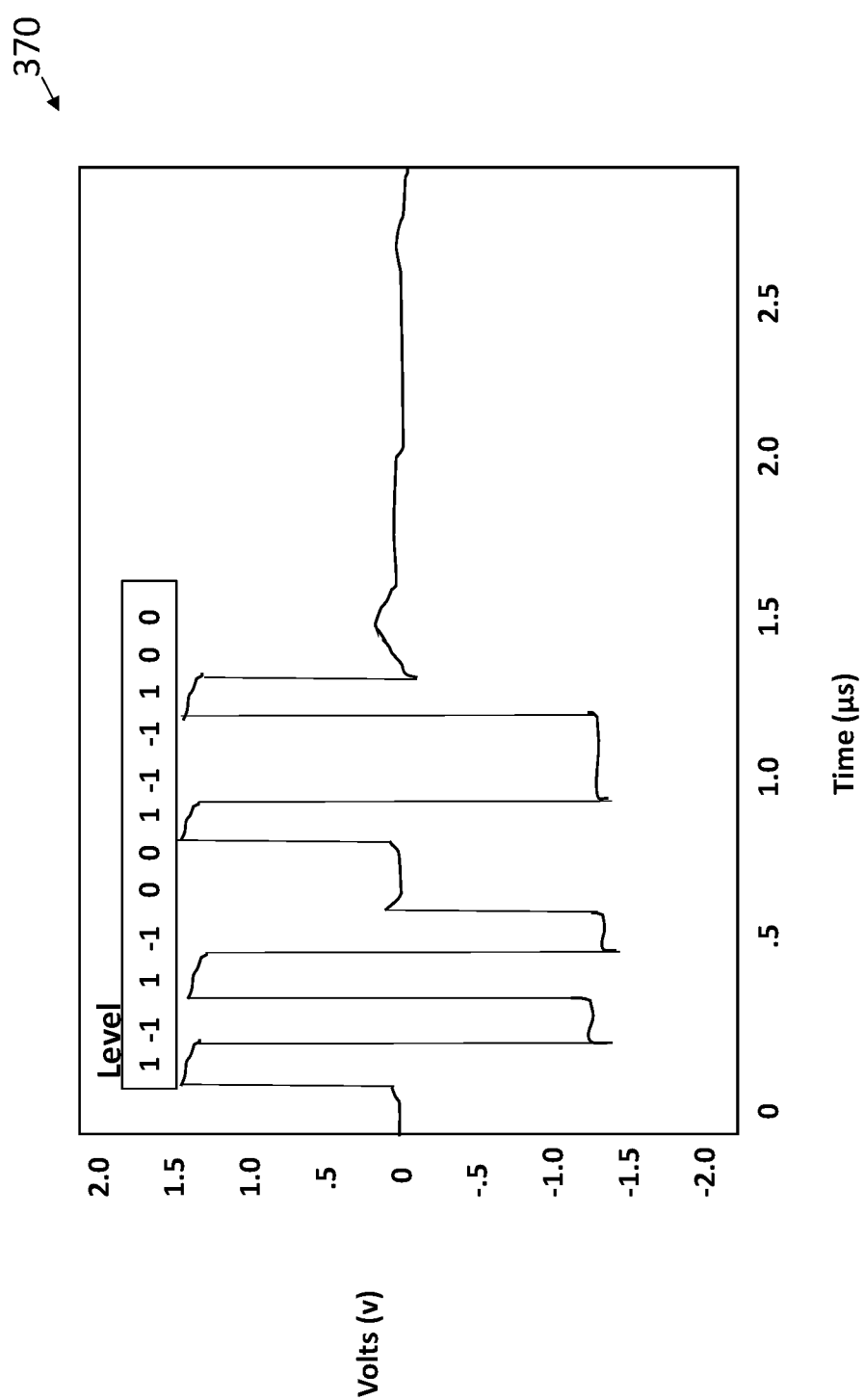
FIG. 7 is a graphical view of simulation results for three-level differential voltage at receiver inputs of a transceiver of a battery cell controller, in accordance with an example embodiment of the present disclosure.

The graphical view 370 of FIG. 7 illustrates a differential voltage seen at inputs of receiver RX of transceiver 222 of an n+1 stage battery cell controller 104 after the encoded data shown in FIG. 10 are output by a transmitter TX 212 of an n stage battery cell controller 102, in accordance with an example embodiment of the present disclosure. The digits shown in the graphical view 1200 correspond with the table 360 of FIG. 6. The data encoding table 360 is for three-bit words in four chips per symbol. A message can be formed of several consecutive symbols, where Y is a number of symbols and 3*Y represents the number of data bits to transmit. At the end of the consecutive symbol inside a message, there is no need to reserve bits to perform a DC balance line code, since each message contains the same number of chips with a −1 level and a +1 level due to the discarding of undesirable combinations of consecutive levels of a symbol.

In some embodiments, the encoder/decoder circuits 266 contain the combinatory code or other code to access register tables stored at an encoding circuit or other element of the system to perform four, eight, or more consecutive transmissions, which can improve a data communication speed. In some embodiments, a register of the control logic of the battery cell controller 102, 104 can include one or more data bits configured to discard all combinations of the 6561 possible combinations for the eight consecutive three-level chips according to one or more criteria, for example, described herein. After such combinations are discarded, 256 combinations may remain for operation.

Figure 8:
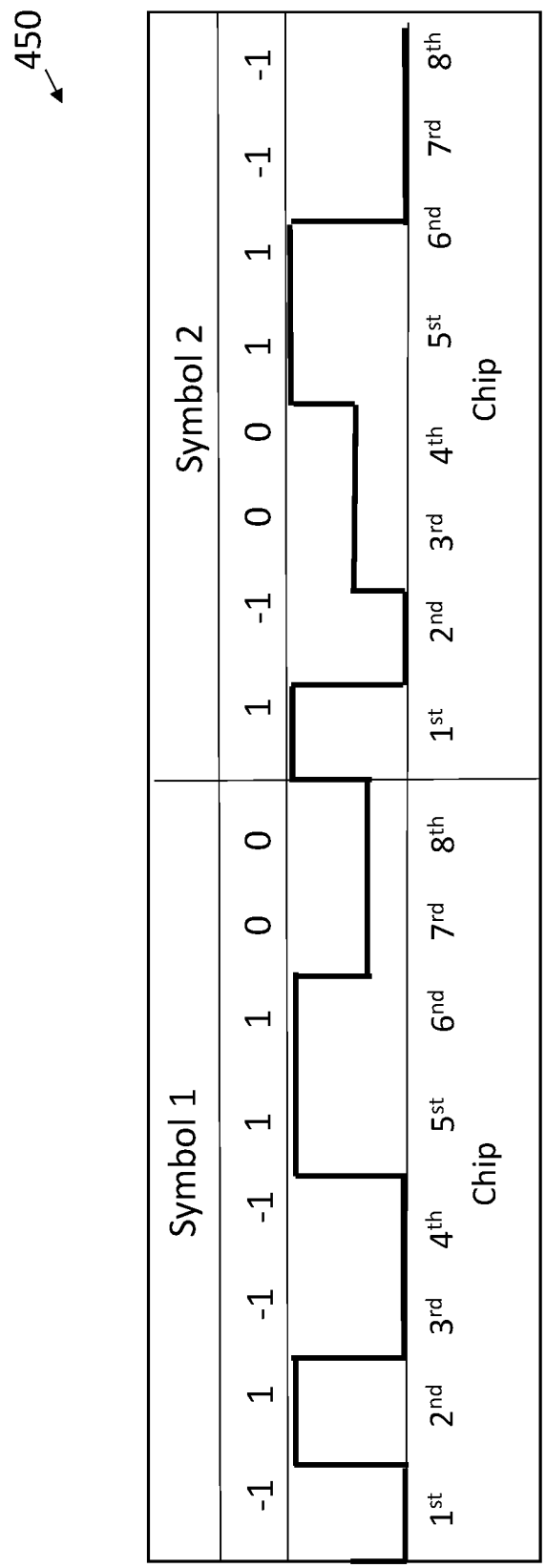
FIG. 8 is an illustrative example of a two-symbol data packet corresponding to sixteen chips or data bits and encoded at three signal levels, in accordance with an example embodiment of the present disclosure.

Referring again to FIG. 8, an example of a two-symbol data packet corresponding to 16 chips or 16 data bits is illustrated according to some embodiments. The data decoding table 480 of FIG. 9 illustrates a set of eight-bit words on eight consecutive chips, or transmissions, for a given symbol. More specifically, the table 480 illustrates 32 of the first 256 codes. Information regarding these combinations may be stored at a storage device, such as an encoding table memory, or registers in the of the control logic of the battery cell controller 102, 104. The signals can assure that any response packet has at least one transition, and that combinations are discarded in compliance with a set of predetermined criteria, for example, criteria described above with respect to table 480 of FIG. 9, e.g., combinations having a same value are discarded in order to avoid saturation of the isolation transformers of the bus 110 and to perform a DC balancing operation with respect to each symbol. In some embodiments, each symbol can encode the information of an eight-bit word into four periods of a fixed frequency, e.g., 4 MHz, resulting in a data communication speed of 8 Mbps. Related encoding techniques may be performed on multi-bit words, ranging from 2-8 bits, or more, in one or more periods of a fixed frequency.

FIG. 10 is a flowchart illustrating a method 500 for multi-level encoding for a battery management system, in accordance with some embodiments. Some or all of the method steps of the flowchart can be generated according to multi-level encoding architecture above. In some embodiments, some or all of the method 500 is executed by a hardware circuit of one or both battery cell controllers 102, 104 and/or MCU 106. For example, an encoded logic circuit 211 and transceiver 212 of battery cell controller 102 and an encoded logic circuit 221 and transceiver 222 of battery cell controller 104 shown in FIG. 1-3 may perform some or all of the method 500.

In operation, at block 502, a circuit of a battery management system, for example, shown in FIGS. 1-3, is constructed and arranged for multi-level encoding, for example, using five different signal levels (e.g., −2, −1, 0, +1, +2), e.g., voltage, current, or amplitude levels, to transmit and receive binary digits, e.g., 1 or 0 bit corresponding to data packets or other units of data, depending on the transitions between the levels. For example, an encoding/decoding circuit 266 of the battery management system encodes logic (1) or (0) bits corresponding to transitions between voltage levels of the different signal levels. In other embodiments, an encoding/decoding circuit 266 of the battery management system performs related encoding functions when exchanging signal information with the bus 110.

In some embodiments, the battery management system includes a multi-level encoding circuit of the SPI/TPL transceiver 105 between the MCU 106 and a battery cell controller 102 to generate signal levels corresponding to consecutive chips providing the symbols used for arranging data for output to the isolated transmission line 110. In some embodiments, the multi-level encoding circuit is part of the battery cell controller 102, 104, and/or other battery cell.

At block 504, a plurality of data units such as nibbles are generated. In some embodiment, a data nibble of a data unit is a five-bit word embedded into a symbol. The data nibbles are generated from the five signal levels (−2, −1, 0, 1, 2) for encoding into the three symbols. The pulse-encoded symbols are then encoded into signal levels to form a set of five bit words.

Figure 11:
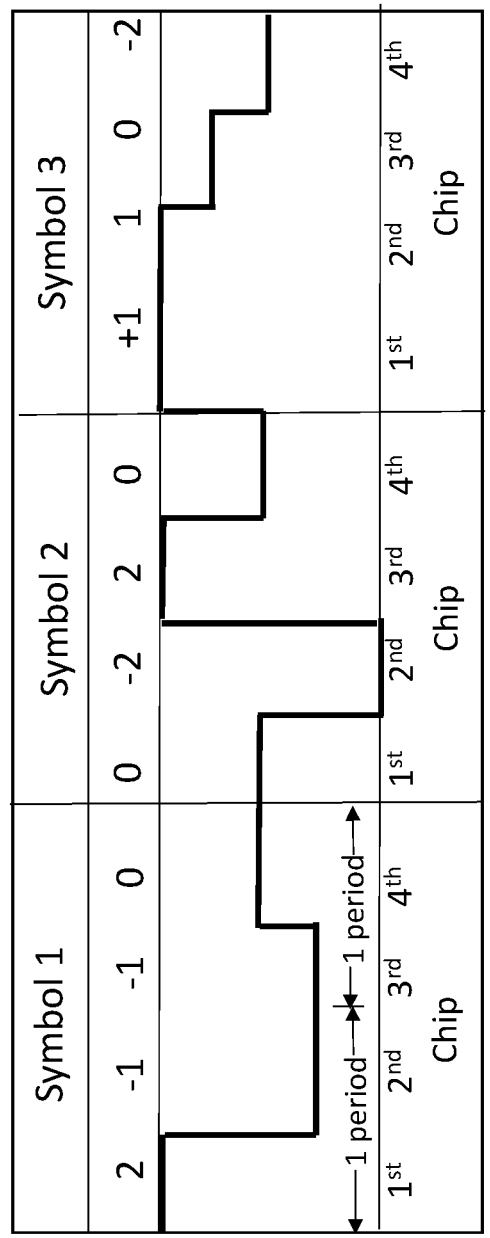
FIG. 11 is an illustrative example of a three-symbol data packet encoded at five signal levels, in accordance with an example embodiment of the present disclosure.

At block 506, each symbol (1-3) is produced with four consecutive transmissions, referred to as 1 through 4th "chips" that each assumes one of the five discrete levels for signal pulses used for encoding positive, negative, and zero, respectively, as shown in the illustration 450 in FIG. 11. The data pulses are single period pulse waves that indicate a logic 1 or 0 value based on the phase.

In some embodiments, as shown in block 508, each symbol encodes the information of a 5-bit word. See for example FIG. 12, which illustrates a data encoding table 580 for five-bit words in four chips per symbol. The data encoding table 580 includes combinations of signal levels or values that are recognized, translated, or otherwise established according to a predetermined computer standard, protocol, criteria, or the like.

Referring again to the illustration 450 in FIG. 11, a three symbol data packet corresponds to twelve (12) chips or fifteen (15) data bits. The communication protocol defines the number of data bits in each message that is related to the number of symbols per message. Referring again to block 308, in some embodiments each symbol transmitted via four (4) chips encodes the information of a five (5) bit word in two (2) periods of a fixed data pulse frequency. By comparison, conventional encoding techniques transmit one (1) bit in two (2) periods, which provide the inventive concept a data communication speed ×5 ratio improvement over such conventional encoding techniques. For example, a 4.0 MHz frequency provided by the MCU 106 and used by a physical layer of a communication protocol may result in a 10 Mbps data communication speed (i.e., 4.0 MHz×two periods/symbol×5 bits). Accordingly, an electrical circuit does not require hardware modifications if it is configured for a particular fixed frequency, such as 4.0 MHz, and embodiments of the data encoding technique described in FIGS. 1-4 and 10-14, respectively, can be applied to improve the data communication speed with no modification to the analog interface design circuitry 212 and 222.

As shown in block 510, and referring again to the table 580 shown in FIG. 12, the data encoding table 580 is constructed and arranged so that undesirable combinations that do not comply with a predetermined criteria are discarded. The following is a set of criteria for discarding various combinations of four consecutive multi-level chips.

In some embodiments, of the 625 possible combinations of the four consecutive five-level chips (see FIG. 11), those combinations containing the same value (2, 1, 0, −1, −2) are discarded, which assures that any response packet having at least one transition in every symbol. Accordingly, low (DC) signal components can be avoided, for example, when the system transmits a '1' as +1 volt and a '0' as −1 volt, making the total number of '0' and '1' bits roughly equal over some interval to provide a DC balanced signal.

In some embodiments, of the 625 possible combinations of the four consecutive five-level chips, all combinations that do not contain a DC balanced code are discarded, which corresponds to discard all combinations when the addition of the four chips' level is not equal to zero. For example, Symbol (1) shown in FIG. 11 is DC balanced, i.e., addition of the four signal levels (2+(−1)+(−1)+0)=0. This criterion allows for the apparatus to avoid the saturation of the isolation transformers 204A, 204B (generally, 204) or to ensure the neutrality of a charge between AC coupling capacitors in embodiments where capacitive isolation is part of the transmission line 110. According, DC balanced coding is performed with respect to physical layers of a communication protocol stack using capacitive and/or transformer isolation transmission configurations.

After the abovementioned criteria is applied, 60 combinations of the 625 possible combinations are available for use. In some embodiments, 32 combinations are selected for the five-bit word having a smaller current consumption parameter than a predetermined threshold value. For example, signal levels of 2 and −2 costs more current for the driver 212, 222 that +1 and −1 levels, while a 0 signal level is not cost for the driver 212, 222. The remaining 28 combinations can be used for the communication protocol, such as fields including start of message, end of message, security, and so on.

Figure 13:
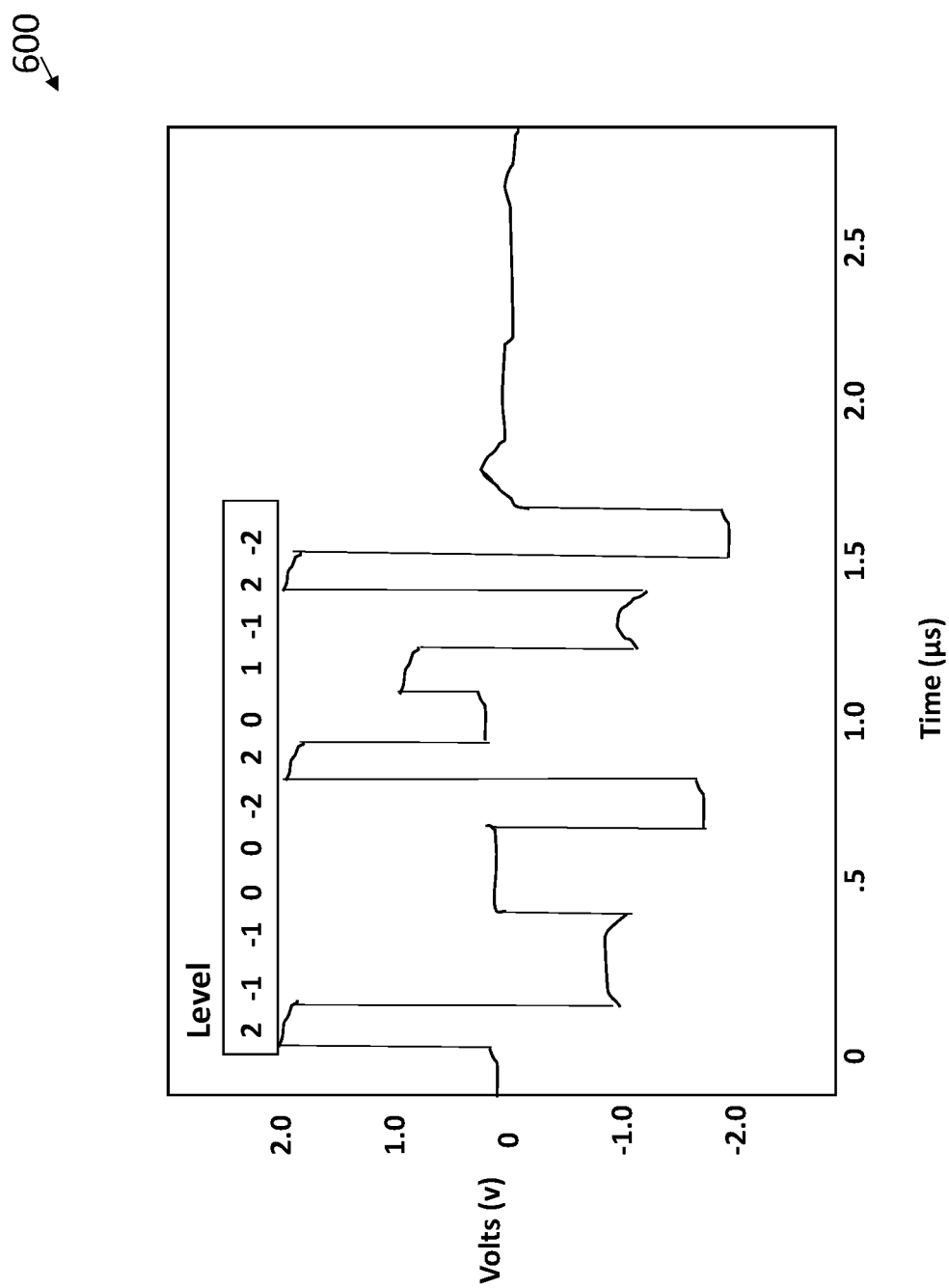
FIG. 13 is a graphical view of simulation results for a five-level differential voltage at a-receiver inputs of a transceiver of a battery cell controller, in accordance with an example embodiment of the present disclosure.

As shown in the example graphical view 600 of FIG. 13, a differential voltage determined at inputs of a receiver RX of a transceiver 222 of a battery cell controller 104 is received from a transmitter TX of a transceiver 211 of another battery cell controller 102 daisy-chained to the receiving battery cell controller 104. In this example, the first battery cell controller 102 is in a first stage (n) where n is an integer. The differential voltage shown in FIG. 13 is received by the inputs of the receiver RX of transceiver 222 in an n+1 stage after transmission in the n stage. In this example, the voltage thresholds for RX1, RX2, RX3, RX4 comparators can be set at −1.5V for level −2, −800 mV for a −1 level, +800 mV for a +1 level and 1.5V for +2 level, but not limited thereto As previously described, FIG. 12 illustrates a data encoding table 580 for five-bit words in four chips per symbol. A message can be formed of several consecutive symbols, where Y is a number of symbols and 5*Y represents the number of data bits to transmit. At the end of the consecutive symbol inside a message, there is no need to reserve bits to perform a DC balance line code, since each symbol is DC balanced with the addition of the four signal levels equals to 0. With a DC balance line executed in the symbol itself, the data encoding is suitable for physical layers using transformer isolation and/or capacitive isolation. Any additional chips in his configuration must be null.

In some embodiments, the signal combination processor can process eight consecutive transmissions, or chips, per symbol, or 390,626 ($5^8$) possible combinations for the eight consecutive five-level chips. In these embodiments, all combinations can be discarded by applying the abovementioned criteria associated with four transmission chips can equally apply, and in doing so, over 12,000 remaining combinations can allow for the encoding of information in a three-bit word. A 4.0 MHz frequency used by a physical layer of a communication protocol may result in a 13 Mbps data communication speed, where each of the eight symbols can encode the information of a three-bit word into four periods of the fixed frequency. In some embodiments, for each of the eight symbols, an encoding/decoding circuit herein encodes a three-bit word in two periods.

Figure 14:
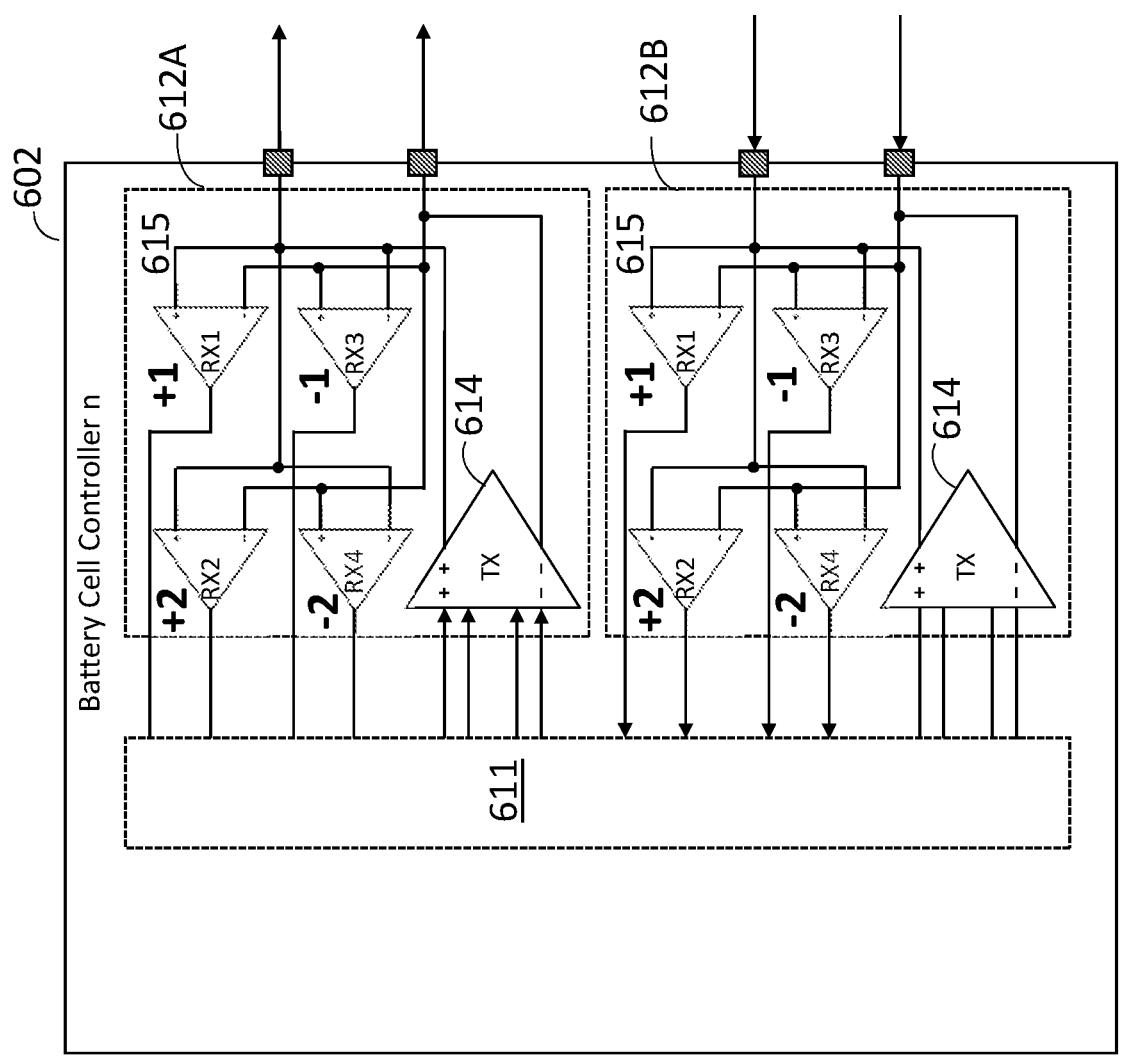
FIG. 14 is a schematic diagram of a battery cell controller having two adaptive multi-level transceivers, in accordance with an example embodiment of the present disclosure.

FIG. 14 is a schematic diagram of a battery cell controller 602 having two adaptive multi-level transceivers 612A, 612B (generally, 612), in accordance with an example embodiment of the present disclosure. The battery cell controller 602 also includes a logic circuit 611, which may be similar to the logic circuit 211 or 221 shown in FIGS. 1-3. Such repetitive details of the logic circuit 611 are therefore not described due to brevity.

In some embodiments, the control logic of the battery cell controller 602 can include in a hardware register of the logic circuit 611 or other storage circuit of the controller 602 a configuration bit, also referred to as a selection bit, that allows to change for a five-level configuration (−2, −1, 0, +1, +2) to a three-level configuration (−1, 0, 1). Changing from a five-level configuration (−2, −1, 0, +1, +2) to a three-level configuration (−1, 0, 1) may result in a reduction in communication speed, but provides the advantage of increasing the robustness of a data communication exchanged via the transmission line 110. For example, if the transmission line 100 is not perfectly matched, there may be rebounds of the signal in the line which can be seen at the receiver of the controller 102, 104 and particularly for a transmission line 110 with a particularly long twisted pair cable 202. In this example, such rebounds may cause a +1 level to be interpreted as a +2 level due to the line integrity. In such cases, the configuration will be configured for three-level decoding for the robustness or integrity of the communication.

Figure 15:
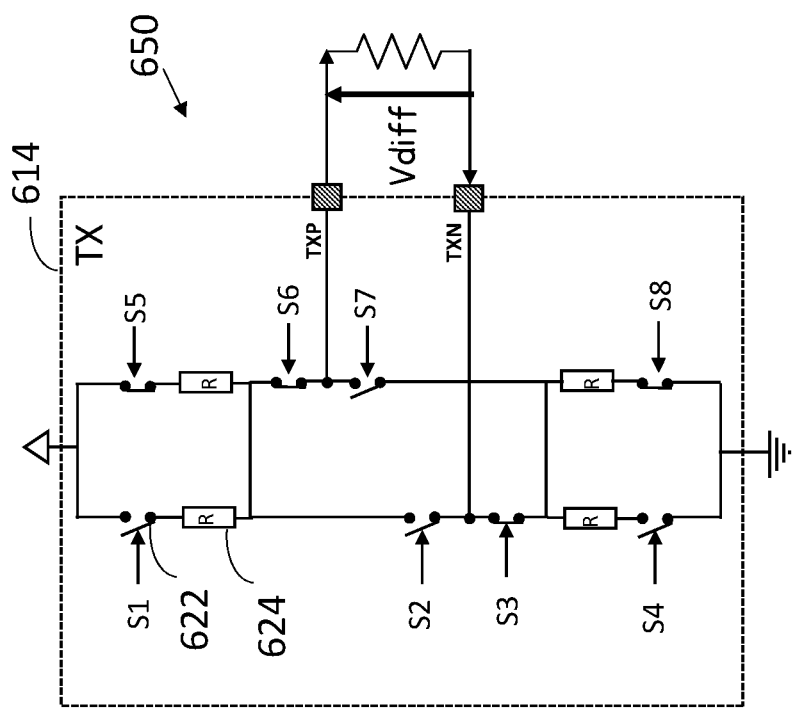
FIG. 15 is a circuit diagram of an adaptive multi-level transmit circuit of FIG. 14.

As shown in FIG. 15, when a previously described five-level coded technique is activated in response to a five-level configuration bit, a transmit circuit 614 of the battery cell controller 602 a plurality of electrical switches 622, e.g., transistors or the like in series with resistors 624, allow the activation of the various signal levels of interest 1 and 2. If one resistor 624 is connected to a pull-up switch 622 and to the ground of a pull-down switch, the differential voltage at analog outputs TXP-TXN is twice greater as compared to a configuration where two resistors 624 are connected in parallel. A plurality of switches of the transmit circuit 614 may be opened or closed in response to various signals S1-S8 in order to activate a level of interest, for example, switching between a five-level configuration (−2, −1, 0, 1, 2) and a three-level (−1, 0, 1) configuration. For example, to transmit a +1 level, the switches S1, S3, S4, S6 are closed, all other open. To transmit a +2 level, the switches S1, S3, S4, S5, S6, S8 are closed, all other switches are open. To transmit a 0 level all the switches S1-S8 are open. To transmit a −1 level, the switches S1, S2, S4, S7 are closed, all other switches are open. To transmit a −2 level, the switches S1, S2, S4, S5, S7, S8 are closed, all other switches are open.

Referring again to FIG. 14, a receive circuit 615 of a transceiver 612 may include four comparators configured for different threshold values to detect the various levels (+2, +1, 0, −1, +2). FIG. 16 is a receiver decoding data table 670 that illustrates a translation between the threshold values of the various receive comparators (RX1-4) of FIG. 14 and a logic receive value corresponding to each level (+2, +1, 0, −1, +2).

As will be appreciated, embodiments as disclosed include at least the following. In one embodiment, a battery management system comprises a first battery cell controller; a second battery cell controller (104), the first battery cell controller and the second battery cell controller each monitoring a plurality of battery cells; and a galvanically isolated transmission line providing a point-to-point signal transmission path between the first battery cell controller and the second battery cell controller. At least one of the first battery cell controller or the second battery cell controller includes: at least one encoding/decoding circuit for encoding data for transmission as a serial data stream along the signal transmission path in compliance with a multi-level encoding technique, including modulating the serial data stream over at least three discrete signal levels at a predetermined and fixed data pulse frequency, encoding a plurality of data nibbles of the serial data stream into a data packet. The at least four consecutive chips per symbol of the data packet includes a DC balanced line code inside each of the symbols.

Alternative embodiments of the battery management system include one of the following features, or any combination thereof.

The battery management system comprises a microcontroller unit that outputs the data to the at least one of the first or second battery cell controller and manages the serial data stream including generating and outputting commands to the encoding/decoding circuit to control transitions between the at least three discrete signal levels; and a driver circuit between the micro controller unit and the transmission line that converts a serial peripheral interface output from the micro controller unit to pulse bit data for output to the transmission line.

The battery management system further comprises a driver circuit between the micro controller unit and the transmission line that reads a plurality of sequential bits from the MCU and translates them to a multi-bit word for output as pulse bit data for output to the transmission line.

The transmission line includes a first transformer isolation circuit coupled to the first battery cell controller; a second transformer isolation circuit coupled to the second battery cell controller; and a twisted pair cable extending between the first and second transformer isolation circuits.

The transmission line includes a first transformer isolation circuit coupled to the first battery cell controller; a second transformer isolation circuit coupled to the second battery cell controller; and a twisted pair cable extending between the first and second transformer isolation circuits.

The battery management system further comprises a logic circuit that includes the at least one encoding/decoding circuit and a logic device that translates each symbol into a multi-bit word for output as the serial data stream to one of the first or second transformer isolation circuit.

The at least four consecutive chips per symbol correspond to four transmissions per symbol.

The first or second battery cell controller includes an adaptive multi-level transceiver including a transmit circuit, a receive circuit, and a logic circuit including a register that processes a configuration bit that controls at least one of the transmit circuit or the receive circuit to change from a first number of signal levels of the multi-level encoding technique to a second number of signal levels of the multi-level encoding technique to accommodate for a determined integrity of the transmission line.

The first number of signal levels is three signal levels and the second number of signal levels is five signal levels.

The at least one encoding/decoding circuit transmits each of the symbols is transmitted via the four consecutive chips and encodes the information of the five bit word in two periods of a fixed data pulse frequency.

The at least one encoding/decoding circuit encodes a three bit word of the data packet in two periods.

The three-bit word is encoded in four chips per symbol.

The plurality of symbols includes eight symbols, and wherein for each of the eight symbols, the at least one encoding/decoding circuit encodes a three-bit word in two periods.

The data packet includes no reserve bits, and includes a same number of consecutive transmissions with a −1 level and a +1 level or a +2 level and a −2 level, and the addition of chips commensurate with the same number of consecutive transmissions is required to be null.

The at least one encoding/decoding circuit comprises: a first-in first-out (FIFO) memory that reads a predetermined number of sequential bits of the serial data stream and translates them to a multi-bit word; and an encoder/decoder that translates the multi-bit word into a pulse encoded symbol comprising the at least four consecutive chips per symbol.

In another embodiment, a method for encoding data bits onto a bus, comprising: configuring a battery cell controller for outputting a serial data stream to galvanically isolated transmission line; modulating the serial data stream over at least three discrete signal levels at a predetermined and fixed data pulse frequency; and encoding a plurality of data nibbles of the serial data stream into a data packet comprising at least three symbols constructed and arranged with at least four consecutive chips per symbol; and discarding combinations of the at least three discrete signal levels to provide DC balanced line code inside each of the symbols.

Alternative embodiments of the method include one of the following features, or any combination thereof.

The logic circuit includes the at least one encoding/decoding circuit and a logic device which translates each symbol into a multi-bit word for output as the serial data stream to a transformer isolation circuit.

The at least one encoding/decoding circuit comprises: a first-in first-out (FIFO) memory that reads a predetermined number of sequential bits of the serial data stream and translates them to a multi-bit word; and an encoder/decoder that translates the multi-bit word into a pulse encoded symbol comprising the at least four consecutive chips per symbol.

The semiconductor device further comprises an adaptive multi-level transceiver (612A, 612B) that includes a transmit circuit, a receive circuit, and a logic circuit including a register that processes a configuration bit that controls at least one of the transmit circuit or the receive circuit to change from a first number of signal levels of the multi-level encoding technique to a second number of signal levels of the multi-level encoding technique to accommodate for a determined integrity of the signal transmission path.

In another embodiments, a method for encoding data bits onto a transmission bus, comprising: configuring a battery cell controller for outputting a serial data stream to galvanically isolated transmission line; modulating the serial data stream over at least three discrete signal levels at a predetermined and fixed data pulse frequency; and encoding a plurality of data nibbles of the serial data stream into a data packet comprising at least three symbols constructed and arranged with at least four consecutive chips per symbol; and discarding combinations of the at least three discrete signal levels to provide DC balanced line code inside each of the symbols.

Alternative embodiments of the method include one of the following features, or any combination thereof.

The method further comprises reading a predetermined number of sequential bits of the serial data stream and translates them to a multi-bit word; and translating the multi-bit word into a pulse encoded symbol comprising the at least four consecutive chips per symbol.

A battery management system comprises a first battery cell controller; a second battery cell controller, the first battery cell controller and the second battery cell controller each monitoring a plurality of battery cells; and a galvanically isolated transmission line providing a point-to-point signal transmission path between the first battery cell controller and the second battery cell controller. At least one of the first battery cell controller or the second battery cell controller includes at least one encoding/decoding circuit for encoding data for transmission as a serial data stream along the signal transmission path in compliance with a multi-level encoding technique, including modulating the serial data stream over at least three discrete signal levels at a predetermined and fixed data pulse frequency, encoding a plurality of data nibbles of the serial data stream into a data packet, the data packet including a plurality of symbols constructed and arranged with at least four consecutive chips per symbol, wherein the at least four consecutive chips per symbol of the data packet includes a DC balanced line code in each of the symbols.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A battery management system, comprising:
a first battery cell controller;
a second battery cell controller, the first battery cell controller and the second battery cell controller each monitoring a plurality of battery cells; and
a galvanically isolated transmission line providing a point-to-point signal transmission path between the first battery cell controller and the second battery cell controller, wherein at least one of the first battery cell controller or the second battery cell controller includes:
at least one encoding/decoding circuit for encoding data for transmission as a serial data stream along the signal transmission path in compliance with a multi-level encoding technique, including modulating the serial data stream over at least three discrete signal levels at a predetermined and fixed data pulse frequency, encoding a plurality of data nibbles of the serial data stream into a data packet, the data packet including a plurality of symbols constructed and arranged with at least four consecutive chips per symbol, wherein the at least four consecutive chips per symbol of the data packet includes a DC balanced line code in each of the symbols.

2. The battery management system of claim 1, further comprising:
a microcontroller unit that outputs the data to the at least one of the first or second battery cell controller and manages the serial data stream including generating and outputting commands to the encoding/decoding circuit to control transitions between the at least three discrete signal levels.

3. The battery management system of claim 2, further comprising:
a driver circuit between the micro controller unit and the transmission line that reads a plurality of sequential bits from the MCU and translates them to a multi-bit word for output as pulse bit data for output to the transmission line.

4. The battery management system of claim 1, wherein the transmission line includes:
a first transformer isolation circuit coupled to the first battery cell controller;
a second transformer isolation circuit coupled to the second battery cell controller; and
a twisted pair cable extending between the first and second transformer isolation circuits.

5. The battery management system of claim 4, further comprising a logic circuit that includes the at least one encoding/decoding circuit and a logic device which translates each symbol into a multi-bit word for output as the serial data stream to one of the first or second transformer isolation circuit.

6. The battery management system of claim 1, wherein the at least four consecutive chips per symbol includes four consecutive transmissions per symbol.

7. The battery management system of claim 1, wherein the first or second battery cell controller includes an adaptive multi-level transceiver including a transmit circuit, a receive circuit, and a logic circuit including a register that processes a configuration bit that controls at least one of the transmit circuit or the receive circuit to change from a first number of signal levels of the multi-level encoding technique to a second number of signal levels of the multi-level encoding technique to accommodate for a determined integrity of the transmission line.

8. The battery management system of claim 1, wherein the first number of signal levels is three signal levels and the second number of signal levels is five signal levels.

9. The battery management system of claim 1, wherein the at least one encoding/decoding circuit transmits each of the symbols is transmitted via the four consecutive chips.

10. The battery management system of claim 1, wherein the at least one encoding/decoding circuit encodes a three bit word of the data packet in two periods.

11. The battery management system of claim 10, wherein the three-bit word is encoded in four chips per symbol.

12. The battery management system of claim 1, wherein the plurality of symbols includes eight symbols, and wherein for each of the eight symbols, the at least one encoding/decoding circuit encodes a three-bit word in two periods.

13. The battery management system of claim 1, wherein the data packet includes no reserve bits, and includes a same number of consecutive transmissions with a −1 level and a +1 level or a −2 level and a +2 level, and the addition of chips commensurate with the same number of consecutive transmissions is required to be null.

14. A semiconductor device, comprising:
a bidirectional transceiver; and
a logic circuit constructed and arranged to encode data for output from the
bidirectional transceiver as a serial data stream along the signal transmission path that is modulated over at least three discrete signal levels at a predetermined and fixed data pulse frequency, the logic circuit encoding a plurality of data nibbles of the serial data stream into a data packet, the data packet including at least three symbols constructed and arranged with at least four consecutive chips per symbol, each chip assuming one of the three discrete signal levels; wherein the at least three symbols are encoded into a subset of a maximum number of possible combinations of the at least three discrete signal levels, and wherein the circuit discards any combinations of the maximum number of possible combinations.

15. A method for encoding data bits onto a transmission bus, comprising:

configuring a battery cell controller for outputting a serial data stream to
galvanically isolated transmission line;
modulating the serial data stream over at least three discrete signal levels at a predetermined and fixed data pulse frequency; and
encoding a plurality of data nibbles of the serial data stream into a data packet comprising at least three symbols constructed and arranged with at least four consecutive chips per symbol; and discarding combinations of the at least three discrete signal levels to provide DC balanced line code inside each of the symbols.

16. The method of claim 15, further comprising:
reading a predetermined number of sequential bits of the serial data stream and translates them to a multi-bit word; and
translating the multi-bit word into a pulse encoded symbol comprising the at least four consecutive chips per symbol.

17. The semiconductor device of claim 14, wherein the logic circuit (211) includes the at least one encoding/decoding circuit (266) and a logic device (250) which translates each symbol into a multi-bit word for output as the serial data stream to a transformer isolation circuit.

18. The semiconductor device of claim 17, wherein the at least one encoding/decoding circuit comprises:
a first-in first-out (FIFO) memory that reads a predetermined number of sequential bits of the serial data stream and translates them to a multi-bit word; and
an encoder/decoder that translates the multi-bit word into a pulse encoded symbol comprising the at least four consecutive chips per symbol.

19. The semiconductor device of claim 14, further comprising an adaptive multi-level transceiver that includes a transmit circuit, a receive circuit, and a logic circuit including a register that processes a configuration bit that controls at least one of the transmit circuit or the receive circuit to change from a first number of signal levels of the multi-level encoding technique to a second number of signal levels of the multi-level encoding technique to accommodate for a determined integrity of the signal transmission path.

20. The battery management system of claim 1, wherein the at least one encoding/decoding circuit comprises:
a first-in first-out (FIFO) memory that reads a predetermined number of sequential bits of the serial data stream and translates them to a multi-bit word; and
an encoder/decoder that translates the multi-bit word into a pulse encoded symbol comprising the at least four consecutive chips per symbol.

* * * * *